Aug. 4, 1970 A. H. LUXEM ET AL 3,523,223

METAL-SEMICONDUCTOR DIODES HAVING HIGH BREAKDOWN VOLTAGE AND LOW LEAKAGE AND METHOD OF MANUFACTURING

Filed Nov. 1, 1967

INVENTORS.
ALLAN H. LUXEM
CONSTANTINOS T. NICOLAOU

BY James C. Faile

ATTORNEY

United States Patent Office 3,523,223

Patented Aug. 4, 1970

3,523,223

METAL-SEMICONDUCTOR DIODES HAVING HIGH BREAKDOWN VOLTAGE AND LOW LEAKAGE AND METHOD OF MANUFACTURING

Allan Harold Luxem and Constantinos Theodore Nicolaou, Dallas, Tex., assignors to Texas Instruments Incorporated, Dallas, Tex., a corporation of Delaware Filed Nov. 1, 1967, Ser. No. 679,880

Int. Cl. H01l 9/00

U.S. Cl. 317—234 1 Claim

ABSTRACT OF THE DISCLOSURE

This specification discloses a metal-semiconductor diode characterized by a mesa of joined layers of oxidation-resistant metal, barrier metal, epitaxial layer of semiconductor material, and monocrystalline substrate, supported on a monocrystalline substrate having ohmic contacts affixed thereto; the mesa having ohmic contacts affixed on top thereof and having its exposed surfaces covered by an insulating, passivating layer. A multistep method of manufacturing the diode is also disclosed.

BACKGROUND OF THE INVENTION

Field of the invention

This invention relates generally to metal-semiconductor diodes, commonly referred to as Schottky diodes.

Description of the prior art

Metal-semiconductor diodes have been used in electronics for some time. Space age demands of high frequencies and miniaturized circuits have required significant innovations such as the planar metal-semiconductor diodes. The planar metal-semiconductor diodes have been formed of a low-resistivity substrate such as lightly doped silicon, a thin epitaxial layer of doped silicon grown on the substrate, a barrier metal layer on and forming a rectifying junction with the epitaxial layer, and ohmic contacts on both the metal and the substrate. Although these planar metal-semiconductor diodes have been very useful at frequencies requiring operating time differentials on the order of picoseconds, they have suffered primarily from two deficiencies—low breakdown voltage and high leakage. Additionally, their noise level while operating needed decreasing. Attempts to cure the deficiencies have included the use of oxide films over the epitaxial layer before the metal is applied. Using a thermal oxide has been demonstrated to be impractical because the out-diffusion of substrate through the thin epitaxial layer at the high temperatures required for forming the thermal oxide grades the epitaxial layer too extensively. Oxide films laid down by low temperature decomposition processes are generally of poor quality and of little help.

SUMMARY OF THE INVENTION

In accordance with the invention, there is provided an improved mesa Schottky diode having a high breakdown voltage, low operating noise, and low leakage comprising:

(a) a monocrystalline substrate material having low resistivity and a given planar area;

(b) a mesa, having a smaller planar area, being formed at its base, integrally with the substrate, and being formed of joined layers of (1) the monocrystalline substrate material, (2) an epitaxial layer 0.01–1.0 mil thick of semiconductor material, integrally monocrystalline with the substrate material, (3) a layer 0.02–0.008 mil thick of a barrier metal, and (4) a layer 0.004–0.010 mil thick of an oxidation-resistant metal;

(c) ohmic contacts affixed, respectively, to the top of the mesa and to the bottom of the substrate; and (d) passivation and insulation layer covering the exposed area of the mesa and a portion of the area of the substrate adjacent thereto.

Also, in accordance with the invention, there is provided a method of manufacturing the mesa-type Schottky diode by the steps of:

(a) preparing a monocrystalline substrate of a low-resistivity material compatible with subsequent epitaxial deposition of a semiconductor material;

(b) growing epitaxially onto the substrate a layer 0.01–1.0 mil thick of semiconductor material;

(c) depositing a film 0.002–0.008 mil thick of a barrier metal;

(d) depositing a film 0.004–0.010 mil thick of an oxidation-resistant metal;

(e) selectively removing areal portions, such that a mesa is left, of the oxidation-resistant metal, of the barrier metal, of the epitaxial semiconductor material, and of a portion of the thickness of the substrate;

(f) cleaning the substrate containing the mesa;

(g) applying ohmic contacts to the top of the mesa and to the bottom of the substrate; and (h) applying an insulating and passivating film to cover the exposed surfaces of the mesa and the portion of the substrate adjacent thereto.

DESCRIPTION OF PREFERRED EMBODIMENT(S)

In application, the mesa Schottky diode of the invention is employed in much the same manner as conventional diodes. It has, however, three major advantages. First, it has a high breakdown voltage. Second, it operates at a low noise level. Third, it has low leakage of electrons therefrom and, consequently, there is less loss of current from circuits employing these mesa Schottky diodes. The table shows a comparison between the mesa Schottky diode of the invention and conventional Schottky diodes. In the table, the operating noise level was measured at about 900 megahertz with 1.5 milliamperes forward current, and the current leakage was measured at about 80 percent of breakdown voltage.

TABLE

| | Break down Voltage (Volts) | Operating Noise Level (Decibels) | Current Leakage (Micro-amperes) |
|---|---|---|---|
| Mesa Schottky Diode | >90 | 6.2 | 0.1 |
| Conventional Schottky Diode | 50 | 7.2 | 100 |

Figure 1:
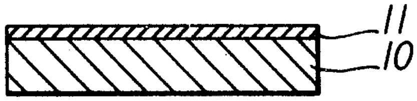
FIGS. 1–7 are cross-sectional views of a typical wafer at different stages in the manufacture of the mesa Schottky diode of the invention.

The mesa Schottky diodes are prepared as illustrated in the figures and as described hereinafter. A substrate 10, FIG. 1, forms the support for epitaxial layer 11. Substrate 10 has low resistivity, i.e., a resistivity less than about 0.01 ohm centimeters. Substrate 10 is monocrystalline and is compatible with continued monocrystalline growth of epitaxial layer 11. Ordinarily, substrate 10 will be composed of a doped semiconductor material, such as suitably doped germanium or silicon. For example, the germanium or silicon may be doped with antimony or arsenic to form an n-type semiconductor material; or with aluminum or gallium to form p-type semiconductor material. Molybdenum has been employed successfully as substrate material, having compatibility with the epitaxial layer, giving good structural support and having the desired low resistivity. For making high frequency semiconductor diodes, the substrate 10 is ordinarily from about 10–30 mils square and no more than a few, e.g., three to five mils thick.

Epitaxial layer 11 is conventional semiconductor material which is grown as a continuation of the monocrystalline growth of substrate 10. Ordinarily, epitaxial layer 11 will be germanium or, preferably, silicon, doped with a donor or an acceptor material to impart the desired semiconductor properties. Suitable acceptor dopants which can be employed to form p-type semiconductor material are aluminum, gallium, or boron. Since Schottky diodes are majority carriers and electrons move more rapidly than holes, it is preferred to employ donor dopant materials such as arsenic, antimony, or phosphorus to prepare n-type semiconductor material in the epitaxial layer. For example, epitaxial layer 11 may be composed of phosphorus-doped silicon. In such an event the substrate 10 will have been placed in a suitable temperature-controlled furnace and vapors of compounds yielding the desired phosphorous-doped silicon passed thereinto and in contact with at least one exposed surface of substrate 10. Typically, the temperature will be controlled at 1150° C.–1230° C. while vapors of trichlorosilane and trimethylphosphate, in a proportion of about 1 to 20 parts trichlorosilane to each part of trimethylphosphate, are carried, in an inert carrier gas, into the temperature controlled region. An epitaxial layer 0.01–1.0 mil thick will be laid down under proper conditions in from about 15–20 seconds to about 25 to 35 minutes, depending on the thickness. These thin layers are employed in order for the finished diode to operate at high frequencies. Excess vapors are flushed from the temperature-controlled furnace and the substrate and epitaxial layer of semiconductor material cooled before the next step.

Figure 2:
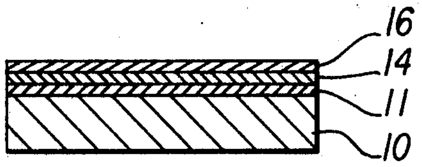

In the next step, a layer 0.002–0.008 mil thick of a barrier metal is deposited onto the epitaxial layer of semiconductor material. The film of barrier metal is shown in FIG. 2 as film 14 on epitaxial layer of semiconductor material 11. Typical barrier metals include nickel, molybdenum, and titanium, the titanium being preferred for extremely high frequency. The barrier metal is deposited by conventional vacuum evaporation techniques to obtain the desired thickness of the barrier metal before the oxidation-resistant metal is deposited thereon.

Next, a layer of oxidation-resistant metal 16, FIG. 2, is deposited atop the barrier metal layer 14. Typical oxidation-resistant metals are gold, palladium, platinum, or silver. A layer 0.004–0.010 mil thick of oxidation-resistant metal is deposited onto the barrier metal. It, also, is deposited by conventional vacuum evaporation techniques.

To form the desired mesa construction, an areal portion of the respective layers of oxidation-resistant metal, of barrier metal, of epitaxial semiconductor material, and of a portion of the substrate may be selectively removed, leaving the mesa atop the remainder of the substrate. Ordinarily, for high frequency operation, the mesa will be 0.1–2.0 mils in diameter. Because of the small diameter of the mesa, at present it is economically advantageous to remove the material and form the mesa by selectively etching. Etching may be done as follows.

Figure 3:
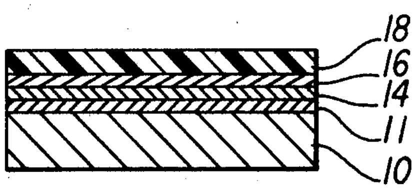
Figure 4:
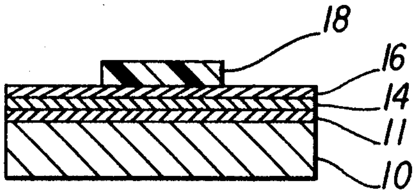

As an initial step in this operation, a layer 18, FIG. 3, of photoresist is employed to cover the layer 16 of the oxidation-resistant metal. The term "photoresist" is applied to a photoresistive material which reacts to light such that by appropriate photolithographic techniques a portion of the film can be washed away and a developed portion remain to protect a desired area. It is convenient to employ conventional photoresistive materials such as Kodak's KMER, which polymerizes when contacted by light. The unexposed portion of layer 18 does not polymerize and can be washed away with suitable developer and solvent, such as trichloroethylene. Thus, the area protected by the remainder of film 18, FIG. 4, will form basically the dimensions of the resulting mesa of the diode.

Figure 5:
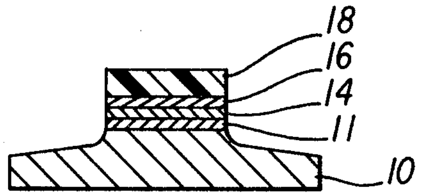

After the protective layer 18 has been formed, the respective layers of oxidation-resistant metal, barrier metal, epitaxial layer, and a portion of the substrate are selectively etched away to form a wafer such as illustrated in FIG. 5.

One method of selectively etching away the areal portions of the respective layers is by reverse radio frequency (R-F) sputtering. Reverse R-F sputtering is discussed by M. E. Lepselter in his article "Beam Lead Technology," Bell System Technical Journal, vol. XLV, No. 2, February 1966, p. 233. Reverse R-F sputtering, commonly called glow discharge etch, employs radio frequency energy to bombard and etch away portions of the metal, the minute particles which are displaced being caused to travel to the opposite electrode under high vacuum.

Alternatively, solutions can be employed in selectively etching away the respective layers. Solutions which can be employed to etch away the respective layers are known and need not be described in detail herein. Briefly, however, a solution of about 11 percent potassium iodide and 6 percent iodine in an aqueous solution can be employed to etch away the oxidation-resistant metal. Similarly, an etch solution of about equal parts of phosphoric, nitric, and acetic acid can be employed to etch away the barrier metal. In like manner, an etch solution of about 50 percent nitric acid and the remainder of about equal parts of hydrofluoric and acetic acid can be employed to selectively etch away the epitaxial layer of semiconductor material and the portion of the substrate which is to be removed.

After the materials have been selectively etched away, the photoresist is physically removed, e.g., by abrasion.

Following removal of the photoresist and before the insulating and passivating film is formed, the wafer of substrate and mesa are cleaned by boiling in ammonium hydroxide. Ordinarily, an entire slice containing many wafers is cleaned simultaneously. For example, a slice may contain about 1,000 wafers, which are cleaned simultaneously when the slice is cleaned.

Figure 6:
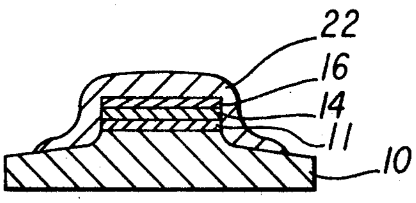

Next, an insulating and passivating film is formed over the wafer. It may be formed as shown in FIG. 6, where the insulating and passivating film 22 covers only the mesa and the portion of the substrate adjacent thereto, or it may be formed over all of the exposed surfaces of the substrate and mesa. The insulating and passivating film must extend a mil or two beyond the mesa for proper stabilization. Preferably, it covers substantially the entire top surface of the substrate. Ordinarily, the insulating and passivating film is not formed over the bottom of the substrate. The insulating and passivating film may be silicon dioxide, in which case it will be formed by low temperature deposition of the material, e.g., by radio-frequency sputtering at temperatures of from 100–375° C.

It is particularly preferred to form the insulating and passivating film from cured, polystyrene-positive photoresist. Such a film is formed by employing polystyrene polymers containing photosensitive azo groups. When exposed to light, there is a depolymerization of the polymer such that when a developer-solvent is subsequently employed the exposed portions are dissolved but the unexposed portion forms an inert, stable film. A group of such polystyrene polymers containing photosensitive azo groups is commercially available under the trade name Azoplate, manufactured and sold by the Shipley Manufacturing Company, Wellesley, Mass., and designated AZ positive photoresist. The AZ positive photoresist material is believed to be described in U.S. Patents 2,958,599; 2,975,053; 2,989,455; 2,994,608; 2,994,609; and 2,995,442.

AZ 1350 has been found satisfactory. By its use, an insulating and passivating film is formed onto the substrate and mesa, and the portion onto which ohmic contacts are to be placed are subjected to light, undergoing depolymerization. The portions contacted by light can then be washed away by a suitable developer-solvent, such as acetone, leaving bare areas atop the mesa and on the bottom of the substrate, in the unlikely event it has been covered.

Figure 7:
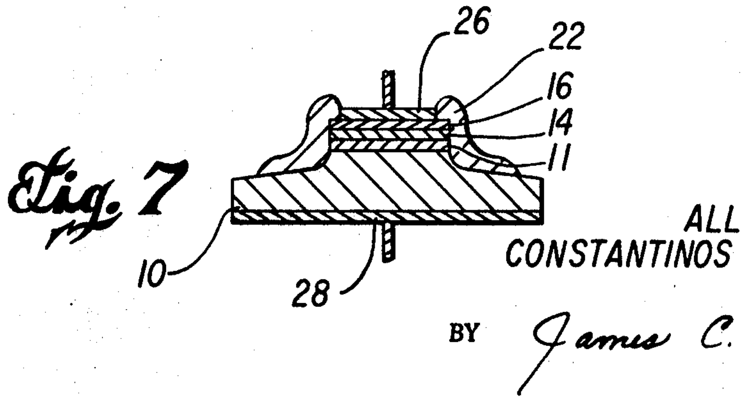

Next, ohmic contacts are applied at the bare areas. The finished Schottky diode is shown in cross section in FIG. 7, in which ohmic contacts 26 and 28 are illustrated, respectively, connected to the top of the mesa and the bottom of the substrate. Typically, the ohmic contact 26 is formed by electrolytic plating of metal, such as silver, onto the oxidation-resistant metal and subsequently bonding an external conductor thereto.

Alto typically, the ohmic contact 28 is formed on the bottom of substrate 10 in two layers. The first layer consists of an electroless deposition of a metal, such as nickel, followed by electrolytic deposition of gold. The electroless deposition of nickel may be effected by immersing the bottom of substrate 10 in an ammoniacal solution of nickel hypophosphate and increasing the temperature to effect deposition of the nickel layer. Ordinarily, a temperature of 60–70° C. is adequate to effect the electroless deposition of the nickel. Following deposition of the first layer of nickel, it is preferably sintered by increasing the temperature thereof to about 550° C. After the first layer of nickel has been sintered, a second layer of nickel is deposited by electroless deposition but without sintering. As a final step in affixing the ohmic contact, gold is electrolytically deposited onto the nickel layer, and an external conductor is subsequently bonded thereto.

What is claimed is:

1. A mesa Schottky diode comprising:

(a) a monocrystalline silicon substrate of n-type conductivity having a resistivity less than about 0.01 ohm-centimeter;

(b) a mesa having a diameter of 0.1 to 2.0 mils, forming integrally at its base with said substrate and comprising:

(1) an epitaxial silicon layer 0.01 to 1.0 mil thick of n-type conductivity, integrally monocrystalline with said substrate;

(2) a molybdenum-comprising layer 0.02 to 0.08 mil thick on said epitaxial layer; and (3) a gold-comprising layer 0.004 to 0.01 mil thick on said molybdenum-comprising layer;

(c) ohmic contacts affixed to the top of said mesa and to the bottom of said substrate, respectively; and (d) a passivation and insulation layer comprising cured polystyrene positive photoresist covering the exposed areas of said mesa and a portion of the area of said substrate adjacent thereto.

References Cited

UNITED STATES PATENTS

| | | | |
|---|---|---|---|
| 3,345,222 | 10/1967 | Nomera et al. | 148—175 |
| 3,290,570 | 12/1966 | Cunningham et al. | 317—240 |
| 3,366,519 | 1/1968 | Pritchard et al. | 156—3 |
| 3,402,044 | 9/1968 | Steinhoff et al. | 96—9 |
| 3,271,636 | 9/1966 | Irvin | 317—234 |
| 3,328,651 | 6/1967 | Miller | 317—235 |

OTHER REFERENCES

Kanv et al.: Molybdenum-Silicon Schottky Barrier, Journal of Applied Physics, July 1966, pp. 2985–2987.

D. Kahng et al.: B.S.T.J., January 1964, pp. 225–232 relied on.

JOHN W. HUCKERT, Primary Examiner

M. H. EDLOW, Assistant Examiner

U.S. Cl. X.R.

317—235